Sept. 29, 1959 L. D. ARMSTRONG 2,906,931
SEMICONDUCTOR DEVICES
Filed Dec. 23, 1954
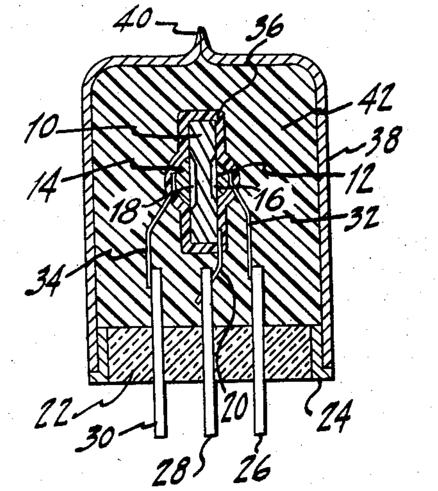
INVENTOR.
LORNE D. ARMSTRONG
BY J. L. Whittaker
ATTORNEY United States Patent Office 2,906,931

Patented Sept. 29, 1959

2,906,931

SEMICONDUCTOR DEVICES

Lorne D. Armstrong, Princeton, N.J., assignor to Radio Corporation of America, a corporation of Delaware Application December 23, 1954, Serial No. 477,295

3 Claims. (Cl. 317—235)

This invention relates generally to semiconductor devices and more particularly to means for protecting the surfaces and rectifying barriers of such devices and for encapsulating such devices.

Heretofore, semiconductor devices such as transistors having rectifying barriers such as P–N junctions have been encased or "potted" in certain plastic materials to protect them from deterioration and to provide mechanical, chemical and electrical stability. However, such potting arrangements sometimes appear to be responsible for unstable operating characteristics, poor shelf life, ineffective heat dissipation, and deterioration during operation. One theory is that such deterioration or instability results from a chemical reaction between the potting material and the semiconductor device and, particularly, the P–N junction portion or rectifying barrier thereof.

In addition, certain plastics have a coefficient of expansion which is different from the coefficient of explansion of the semiconductive materials to which they are bonded. Thus, when the plastic sets, stresses are set up within the device which may deform the barriers or the terminal leads attached to, or in contact with, the junction material. Excessive deformation causes the effective barrier resistance between the junction material and the semiconductor to be reduced to undesirably small values and may even result in a short circuit therebetween.

An object of the invention is to provide an improved semiconductor device construction.

Another object of the invention is to improve encapsulation of a semiconductor device.

Still another object of the invention is to reduce deleterious surface reactions and improve mechanical shock absorption in encapsulated semiconductor devices.

The principles and objects of this invention are accomplished by encapsulating a semiconductor device in moisture repellent organic silicone materials and, in particular, in a combination of such materials. In one embodiment of the invention a semiconductor device, and in particular the exposed rectifying barriers thereof, are coated with a thin layer of a first silicone material particularly suited for protecting the rectifying barriers and the surface of the semiconductor material in the vicinity thereof. The device thus treated is then embedded in a quantity of a comparatively soft silicone material which serves to repel moisture, as a shock absorber for the device, and as an efficient heat conducting medium. The device thus protected is preferably then enclosed in a hermetically sealed container.

The invention is described in greater detail with reference to the accompanying drawing in which:

The single figure of the drawing is a sectional elevational view of a typical embodiment of a semiconductor device according to the invention.

Similar reference characters are applied to similar elements throughout the drawing.

Referring to the drawing, a typical semiconductor device such as a triode transistor includes a body 10 of semiconductor material such as germanium, silicon, or the like, or intermetallic compounds such as gallium antimonide or indium arsenide, having rectifying electrodes 12 and 14 in rectifying contact therewith. The electrodes 12 and 14 are employed as the emitter and collector electrodes of the transistor and they may be surface barrier films or plates, point-contact elements, or they may be P–N junction electrodes of the alloy or fusion type described by Law et al. in an article entitled "A Developmental Germanium P–N–P Junction Transistor" in the November 1952 Proceedings of the IRE.

Such alloyed junction electrodes are formed, generally, by alloying separate pellets of a so-called impurity material with the semiconductor body. By this process, rectifying barriers are formed within the semiconductor body and extend to the surface of the body where they separate what was formerly the impurity pellet from the body of the crystal. The electrodes 12 and 14 are assumed to be P–N junction electrodes having rectifying barriers 16 and 18 respectively exposed on opposite surfaces of the body or crystal 10. It is the barriers 16 and 18 which are protected according to the invention without mechanically or electrically disturbing the rectifying electrodes 12 and 14 themselves.

A base electrode 20 of nickel or the like is bonded in ohmic (non-rectifying) contact to the crystal 10. The transistor is mounted on a stem which comprises a disk 22 of glass or the like having a surrounding ring 24 of cold rolled steel or the like and having support rods 26, 28, 30 extending therethrough. The base electrode 20 is welded to the rod 28 and the electrodes 12 and 14 are connected to the rods 26 and 30 by lead wires 32 and 34, respectively.

According to the invention, at least the exposed barrier and electrode regions of the transistor are provided with an encapsulating coating 36 of a moisture-repellent, resilient organic silicone material. The coating 36 is preferably a thin film of a silicone material known as SR98 supplied by General Electric Company. SR98 is a silicone resin containing methyl and phenyl groups attached directly to silicon atoms and having an average resin (methyl and phenyl groups) to silicon ratio of approximately 1.2:1. The SR98 is made up in solution in xylene before application to the transistor by painting, brushing or by some other suitable process.

The silicone resin SR98 is particularly suited for the purposes of the present invention since it forms, on evaporation of the xylene, a resilient body which substantially eliminates mechanical strain on the electrodes 12 and 14 and efficiently absorbs mechanical shock to the transistor. In addition, this material is insulating and inert and does not react chemically with the semiconductor crystal, the P–N junction barrier, or any of the components of the transistor. The SR98 resin is also moisture repellent and, thus, further chemically protects the transistor. The coating of SR98 resin is cohesive and bonds intimately to the transistor and exhibits surface neutrality, that is, it does not polarize.

According to one method of encapsulation, the transistor coated with the layer 36 of SR98 silicone resin is stored for 30 minutes in an atmosphere having a maximum relative humidity of 50% and a temperature of 30° C., after which it is baked in air at about 105° C. for about 4 hours to dry the resin which sets to a rubber-like consistency.

The transistor construction is preferably completed by hermetically sealing a metal shell 38 to the stem ring 24 by means of solder, by welding or in any other suitable manner. If desired, an exhaust tubulation 40 may be provided on the shell 38 by means of which the shell is evacuated. The tubulation is pinched off after the evacuation is effected. Instead of evacuating the housing, it may be filled with an inert gas, such as argon or helium, or, in some cases, ordinary air atmosphere may be permitted to remain.

The above-described transistor construction may be modified as shown in the drawing to provide improved mechanical properties and, in addition, to provide improved thermal dissipation so that the transistor may be operated at higher ambient temperatures and power levels. To this end, the metal shell 38 may contain, or be filled by, a water-repellent, inert, insulating, comparatively soft potting material 42, for example, a silicone grease known as Dow Corning No. 4 surrounding the transistor coated with the SR98 silicone resin. Dow Corning No. 4 silicone grease is a dimethyl silicone polymer containing a small quantity of a siliceous filler. According to the preferred procedure, the shell 38 is first degreased and baked to remove moisture and is then filled approximately ¾ full of the silicone grease. The shell is then baked to effect drying in a non-circulating air oven for a minimum of one hour at about 105° C. The shell 38 is then hermetically sealed to the stem ring 24.

The silicone grease, Dow Corning No. 4, is preferred for potting the transistor because (1) it does not react chemically either with the junction or with the resilient layer 36; (2) it is of high resistivity; (3) it is relatively soft and exhibits high mechanical resilience; (4) it has a high moisture rejection characteristic; and, (5) it retains its soft grease-like character from −40° C. to 200° C.

If desired, the thermal conductivity of the silicone grease potting material may be enhanced by dispersing therein particles of good thermal conductance, such as a metal such as oxidized aluminum.

Devices fabricated in accordance with the foregoing method and employing the above-described combination of silicone materials suffer substantially no chemical reaction at the rectifying junctions and substantially no deterioration of the junctions. In addition, such devices remain substantially free of moisture which adversely affects such devices. The resilient protective silicone coatings counteract mechanical stresses which also often adversely affect the characteristics of semiconductor devices.

What is claimed is:

1. A circuit element comprising an insulating support member, conductive support rods extending through said member, a semiconductor device carried by said member and having a rectifying barrier exposed at a surface thereof, a layer of a resilient, rubber-like silicone resin in intimate contact with said device and protecting said barrier, said silicone resin containing methyl and phenyl groups attached directly to silicon atoms with the ratio of said groups to silicon atoms being about 1.2:1, a body of a thermally conducting silicone grease surrounding said device, said silicone grease comprising a dimethyl silicone polymer containing a siliceous filler, and an enclosing shell hermetically sealed to said support member and in intimate contact with said silicone grease.

2. The circuit element of claim 1 including a quantity of good thermally-conducting particles dispersed in said silicone grease.

3. The circuit element of claim 1 including particles of a metal dispersed in said silicone grease.

References Cited in the file of this patent

UNITED STATES PATENTS

| | | |
|---|---|---|
| 2,625,592 | Sueur et al. | Jan. 13, 1953 |
| 2,688,110 | Domaleski et al. | Aug. 31, 1954 |
| 2,704,340 | Baird | Mar. 15, 1955 |
| 2,720,617 | Sardella | Oct. 11, 1955 |
| 2,725,312 | Schell | Nov. 29, 1955 |
| 2,758,261 | Armstrong et al. | Aug. 7, 1956 |
| 2,809,332 | Sherwood | Oct. 8, 1957 |
| 2,844,769 | Erkelens et al. | July 22, 1958 |